US007466202B2

(12) United States Patent
Karthaus et al.

(10) Patent No.: US 7,466,202 B2
(45) Date of Patent: Dec. 16, 2008

(54) HIGH-SPEED CMOS CURRENT MIRROR

(75) Inventors: Udo Karthaus, Ulm (DE); Peter Kolb, Illertissen (DE)

(73) Assignee: Atmel Germany GmbH, Heilbronn (DE)

( * ) Notice: Subject to any disclaimer, the term of this patent is extended or adjusted under 35 U.S.C. 154(b) by 63 days.

(21) Appl. No.: 11/783,418

(22) Filed: Apr. 9, 2007

(65) Prior Publication Data

US 2007/0285171 A1 Dec. 13, 2007

(30) Foreign Application Priority Data

Apr. 7, 2006 (DE) ....................... 10 2006 017 989

(51) Int. Cl.
*H03F 3/04* (2006.01)

(52) U.S. Cl. ....................................... 330/288; 323/315

(58) Field of Classification Search ................. 330/288; 323/315, 316

See application file for complete search history.

(56) References Cited

U.S. PATENT DOCUMENTS

| | | | |
|---|---|---|---|
| 4,786,856 A | 11/1988 | Metcalf | |
| 5,521,490 A | 5/1996 | Manohar | |
| 5,801,523 A * | 9/1998 | Bynum | 323/315 |
| 5,801,581 A | 9/1998 | Koizumi | |
| 5,864,228 A | 1/1999 | Brown | |
| 5,949,278 A | 9/1999 | Oguey | |
| 6,064,267 A * | 5/2000 | Lewyn | 330/288 |
| 6,617,915 B2 * | 9/2003 | Rajan | 327/538 |
| 6,803,808 B2 * | 10/2004 | Wu | 327/538 |
| 7,332,965 B2 * | 2/2008 | Seth et al. | 330/288 |
| 2004/0056708 A1 | 3/2004 | Bedaride | |

FOREIGN PATENT DOCUMENTS

| | | |
|---|---|---|
| DE | 697 08 167 | 6/2002 |
| EP | 0733961 A1 | 9/1996 |
| EP | 0768760 A1 | 4/1997 |
| EP | 0788046 | 8/1997 |

OTHER PUBLICATIONS

Tietze/Schenk, “Halbleiterschaltungstechnik” (Semiconductor Technology), ISBN 3-540-19475-4, 9th ed., Springer-Verlag, Berlin/Heidelberg/New York, pp. 96 and 97.

A Novel Highspeed Current Mirror Compensation Technique and Application, Thart Fah Voo, Toumazou, C., IEEE International Symposium on Circuits and Systems; 1995, vol. 3, Apr. 28 to May 3, 1995, pp. 2108 to 2111.

* cited by examiner

*Primary Examiner*—Henry K Choe
(74) *Attorney, Agent, or Firm*—Muncy, Geissler, Olds & Lowe, PLLC

(57) ABSTRACT

A CMOS current mirror is provided that includes a current input, an input transistor, whose conductivity path is located between the current input and a reference potential terminal, a current output, an output transistor, whose conductivity path is connected to the reference potential terminal and which supplies the current output with an output current, a gate node common for both transistors, and a supply potential terminal. The current mirror further includes a first additional transistor, whose conductivity path is located between the supply potential terminal and the gate node and whose gate terminal is connected to the current input, and a second additional transistor, whose conductivity path is located between the gate node and the reference potential terminal and whose gate terminal is connected to the gate node.

14 Claims, 5 Drawing Sheets

HIGH-SPEED CMOS CURRENT MIRROR

This nonprovisional application claims priority under 35 U.S.C. § 119(a) on German Patent Application No. 102006017989, which was filed in Germany on Apr. 7, 2006, and which is herein incorporated by reference.

BACKGROUND OF THE INVENTION

1. Field of the Invention

The present invention relates to a CMOS current mirror.

2. Description of the Background Art

A type of CMOS current mirror is known, for example, from Tietze/Schenk, "Halbleiterschaltungstechnik" (Semiconductor Technology), ISBN 3-540-19475-4, 9$^{th}$ ed., Springer-Verlag, Berlin/Heidelberg/New York, pp. 96 and 97. A current mirror with a resistor between gate terminals of an input and output transistor is known furthermore from the publication "A Novel Highspeed Current Mirror Compensation Technique and Application", Thart Fah Voo, Toumazou, C., IEEE International Symposium on Circuits and Systems; 1995, Vol. 3, 28 Apr. to 3 May 1995, pages: 2108 to 2111. Furthermore, current mirrors with cascode transistors for increasing the output resistance are conventional in the art. Various CMOS current mirrors are also disclosed in U.S. Patent Application 2004/0056708 A1.

The principle of action of a CMOS current mirror is based on the operation of the input transistor and the output transistor with same gate-source voltage in the saturation region. If both transistors are identical, the same currents flow in their conductivity paths. In this regard, a conductivity path is understood to be a current path connecting the drain and source of a MOS transistor with inclusion of channel regions and optionally present drift regions. If transistors with different transistor geometries are used in the input branch and output branch, the quotient $w_2*l_1/l_2*w_1$ determines the quotient of the output current strength and input current strength, which is also called the current transformation ratio. Here, w indicates the channel width, l the channel length, the subscript 1 the input transistor, and the subscript 2 the output transistor. In addition, current mirrors permit generation of integer multiples or fractions of the input current by parallel connection of a suitable number of identical transistors to the output transistor or the input transistor.

Changes in the input current do not arise without a delay, but with a certain delay in the output current, which depend on the transconductances gm of the transistors, therefore on the quotients of the drain currents in the numerator and gate-source voltages in the denominator, and on the gate-source capacitance of the transistors. This delay is troublesome for some applications. High rates of change in the output current are required, for example, in high-speed current DACs (DAC=digital analysis converter) and laser drivers in CD and/or DVD devices during rapid writing processes. The invention is not limited to such applications, however. Rather, DACs have found wide use, so that the invention can be used wherever such DACs have a current output and must be reasonably fast.

The following list gives a few examples, whereby the enumeration is not definitive: low cost measuring technology, programmable voltage sources and current sources, measuring technology in the automotive sector, precision motion control as in the printing industry, regulators in the automotive sector, digital programmable current loops, as they are used in telecommunications, programmable logic controllers, input/output cards, mobile telephones, high-speed digital/analog testers, pagers, fiber optic switching exchanges, power amplifiers, and control of voltage-controlled oscillators (VCO control). Current mirrors are also used otherwise in many different ways in the design of integrated circuits, for example, for supplying current to circuit parts such as amplifiers or mixers, for analog signal processing, or as interfaces between two circuits, because transmission of currents is less sensitive than transmission of voltages to interference in a reference potential.

In the aforementioned conventional current mirror, which has an ohmic resistor connected between the gate terminals of the input and output transistors, the rise and response time of the output current after a change in the input current depends on the value of the resistance and on the current. In this case, the optimal resistance value changes with the current and therefore must be constantly adapted.

SUMMARY OF THE INVENTION

It is therefore an object of the present invention to provide a current mirror with which the input currents with short rise times and a large amplification can be mirrored in the output currents. A large amplification in this case is understood to be, for example, a 10-fold to 20-fold amplification.

According to an embodiment, a first additional transistor makes possible a rapid charging of the gate terminals of the input and output transistors of the current mirror. However, this presumes a second additional transistor, which makes possible a first current flow through the first additional transistor. A current can be discharged from the common gate node of the input and output transistors through the second additional transistor, although the gate terminals of these two transistors do not take up any current. This current mirror has as an advantage shorter rise times than the current mirrors known from the aforementioned publication "Halbleiterschaltungstechnik" (Semiconductor Technology). In comparison with the current mirror working with an ohmic resistor between the gate terminals of the input transistors and the output transistors, the current mirror presented here has the advantage that no adapting to the current strength is necessary.

A tendency for signal overshoot and ringing can be countered with an embodiment, in which the current mirror has a damping network of damping transistors, which is connected to the current input and the reference potential terminal.

In an embodiment, a damping network has a first damping transistor, a second damping transistor, and a third damping transistor, whereby a conductivity path of the first damping transistor can be located between the current input and the reference potential terminal, a conductivity path of the second damping transistor can be located between the supply potential terminal and a gate terminal of the first damping transistor, a conductivity path of the third damping transistor can be located between the gate terminal of the first damping transistor and the reference potential terminal, and a gate terminal of the second damping transistor can be connected to the current input and a gate terminal of the third damping transistor to the gate terminal of the first damping transistor.

The damping network of the damping transistors behaves like a series connection of two NMOS diodes and lowers the input resistance of the current mirror at the current input I_in. In this case, a MOS diode is understood to be a MOS transistor with a connected drain and gate. As a desired result, the three damping transistors dampen the aforementioned overshoot.

In an alternative embodiment, the damping network can have a series connection of two transistor diodes, which is located between the current input and the reference potential terminal. This type of current mirror with only two transistors behaves like the CMOS current mirror with the damping network having three transistors.

The current mirror can have an output cascode transistor, whose conductivity path lies between the current output and the conductivity path of the output transistor. Due to the output cascode transistor, this current mirror has an increased output resistance. Also, a gate terminal of the output cascode transistor can be connected to the current input.

In another embodiment, the current mirror can have a current input with a main current input and an auxiliary current input, as well as an input cascode transistor, whereby the conductivity path of the input cascode transistor is connected with one end to the main current input and with the other end forms the auxiliary current input. The gate terminals of the input cascode transistor and of the output cascode transistor are connected to one another and to a cascode control terminal, and the gate terminal of the first additional transistor is connected to the auxiliary current input.

This embodiment is characterized by reduction of the input voltage, necessary for operation at the current input or at the main current input I_in, from two gate-source voltages to one gate-source voltage. In addition, this embodiment also has an increased output resistance.

In an embodiment as a current bank, the CMOS current mirror can have several output transistors, whose conductivity paths are connected to the reference potential terminal and each of which supply a current output with an output current and whose gate terminals are connected to the common gate node. In this way, a multiple of the input current can be generated as output current.

Furthermore, the current mirror can have a disable input, which is connected to a gate terminal of at least one disable transistor and whereby a conductivity path of the disable transistor is located between the current input and the reference potential terminal or between the common gate node and the reference potential terminal.

An alternative embodiment is characterized by two disable transistors, whereby the disable input is connected to a gate terminal of the first disable transistor and a gate terminal of the second disable transistor, whereby a conductivity path of the first disable transistor is located between the current input and the reference potential terminal and a conductivity path of the second disable transistor is located between the common gate node and the reference potential terminal.

These embodiments each also permit rapid switching off of the current mirror by application of a signal driving the disable transistors at the disable input.

In another embodiment, the current mirror can have at least one damping subnetwork with a connection path to the common gate node, whereby the connection path has a controllable resistor. Another embodiment can have several damping subnetworks each with a connection path to the common gate node, whereby each connection path has a controllable resistor.

The damping can be varied in a controlled manner by these features.

In an embodiment, damping subnetworks have additional damping transistors, and switches as controllable resistors. The more switches are closed, the shorter the rise time and the lower the damping of the current mirror. The damping action can be set stepwise by connecting or disconnecting individual discrete subnetworks.

An embodiment is characterized in that the controllable resistor is realized in the resistance region of the operated MOS transistor.

As a desired result, this embodiment permits a continuous setting of the damping action of a single damping subnetwork.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
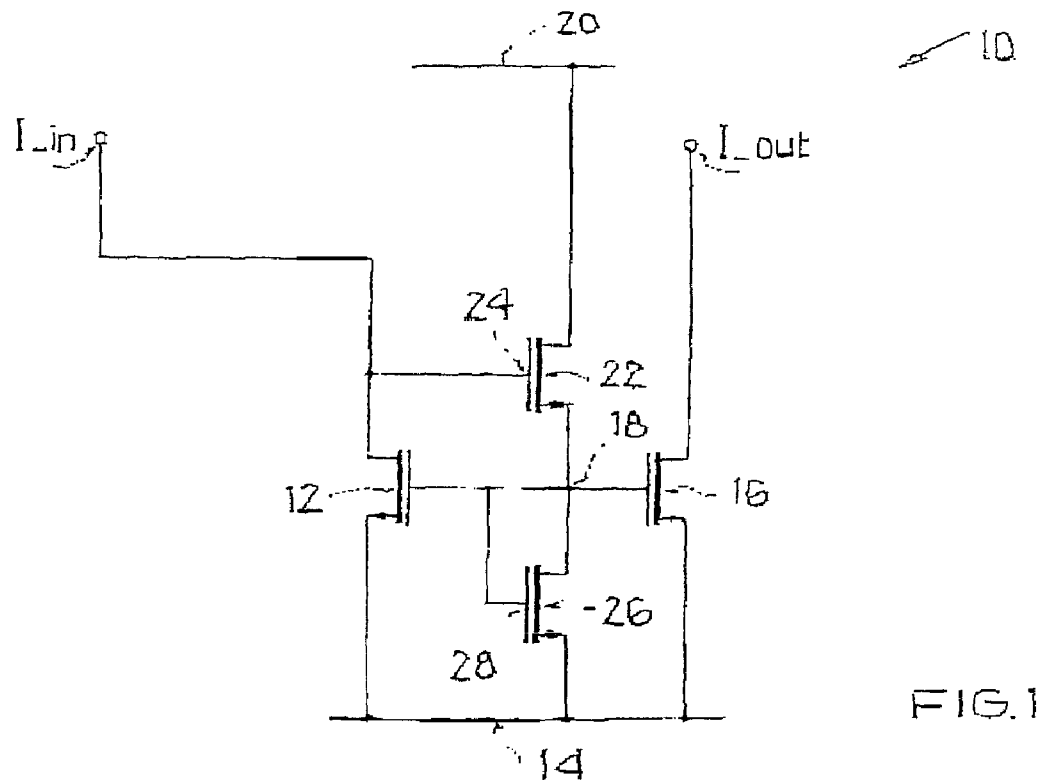
FIG. 1 illustrates a first exemplary embodiment of a current mirror with the features of the invention.

FIG. 1 shows a CMOS current mirror 10 with a current input I_in, an input transistor 12, a reference potential terminal 14, a current output I_out, and an output transistor 16. The conductivity path of input transistor 12 is located between the first current input I_in and reference potential terminal 14. The conductivity path of output transistor 16 is located between the current output I_out and reference potential terminal 14. Gate terminals of both transistors 12, 16 are connected to a common gate node 18. Current mirror 10 furthermore has a supply potential terminal 20. A first additional transistor 22 has a conductivity path, located between supply potential terminal 20 and gate node 18. Gate terminal 24 of first additional transistor 22 is connected to the current input I_in. The conductivity path of a second additional transistor 26 is located between gate node 18 and reference potential terminal 14. Gate terminal 28 of second additional transistor 26 is also connected to gate node 18.

First additional transistor 22, connected as a source follower, accelerates the charging of gate node 18 with an increasing current across the current input I_in. First additional transistor 22 thereby functions dynamically similar to a beta-helper in bipolar current mirrors. In contrast to base terminals of bipolar transistors of a bipolar current mirror, the gate terminals of input transistor 12 and output transistor 16 take up no DC current, however. In order to nevertheless enable a DC current through first additional transistor 22, second additional transistor 26 is provided. Second additional transistor 26 in the embodiment of FIG. 1 is connected as a diode to a gate terminal 28 connected to gate node 18. Basically, second additional transistor 26 could also be connected in a source circuit to a suitable bias voltage at gate terminal 28. Current mirror 10 would then be slower, however. The shown diode circuit of second additional transistor 26 has the advantage that the transconductances gm of both additional transistors 22 and 26 add up.

Current mirror 10 according to FIG. 1, in comparison with prior-art current mirrors, has a greatly shortened rise time of the output current after a rise in the input current. However, it tends toward too great overshoot and ringing.

Figure 2:
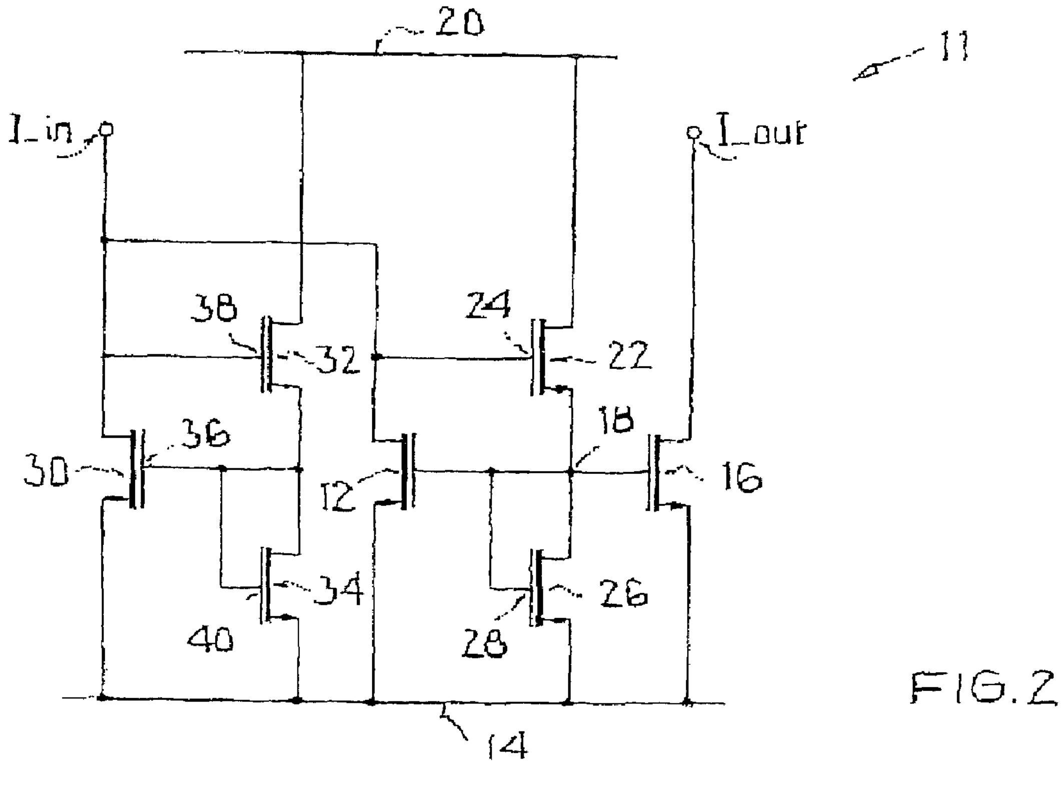
FIG. 2 illustrates the current mirror of FIG. 1 with a first embodiment of a damping network.

As a remedy, CMOS current mirror 11, shown in FIG. 2, has a first embodiment of a damping network of damping transistors 30, 32, and 34, which is connected to the current input I_in and reference potential terminal 14.

In this case, a conductivity path of first damping transistor 30 is connected to the current input I_in and reference potential terminal 14. A conductivity path of second damping transistor 32 is located between the supply potential terminal 20 and a gate terminal 36 of first damping transistor 30. A conductivity path of third damping transistor 34 is located between gate terminal 36 of first damping transistor 30 and reference potential terminal 14. Furthermore, a gate terminal 38 of second damping transistor 32 is connected to the current input I_in and a gate terminal 40 of third damping transistor 34 is connected to gate terminal 36 of first damping transistor 32.

In other respects, CMOS current mirror 11 is based on CMOS current mirror 10 and also has elements 12 to 28. This also applies to the additional embodiments of CMOS current mirrors shown in FIGS. 3 to 9. In all figures, the same reference characters in each case describe the same elements.

The damping network of the three damping transistors 30, 32, 34 behaves like a series connection of two NMOS diodes and lowers the input resistance of current mirror 11 at the current input I_in. As a desired result, the three damping transistors 30, 32, and 34 dampen the aforementioned overshoot. The input current flowing in the current input I_in depending on the size of damping transistor 30 and input transistor 12 divides in a specific ratio between these transistors 30, 12. This ratio determines the damping. The more current flows through damping transistor 30, the greater the damping. The more current flows through input transistor 12, the shorter the delay with which an increase in current in the output current follows a current increase in the input current of current mirror 10. Nevertheless, as the rise time becomes shorter, the damping also declines, so that the dimensioning of resistors 10, 12 always represents a compromise.

Figure 3:
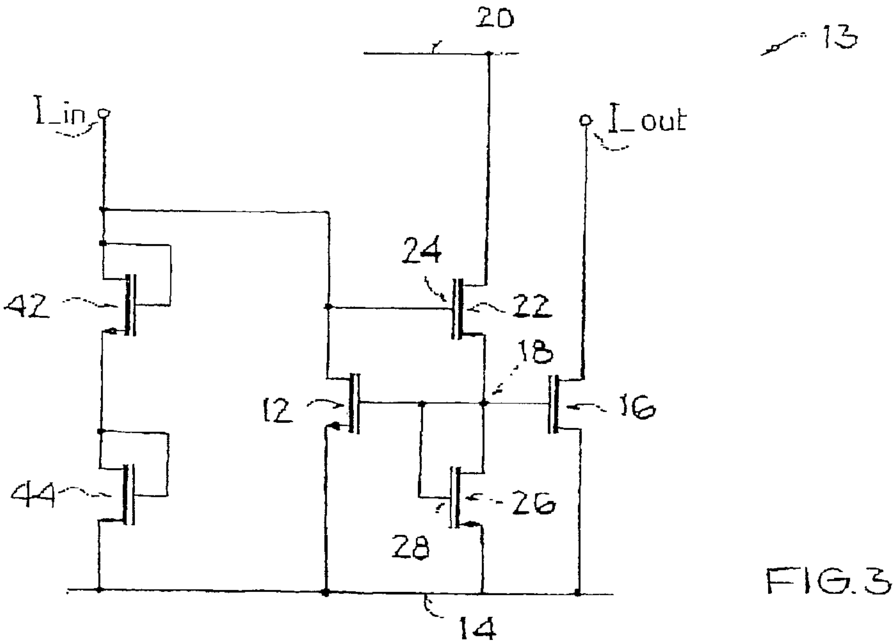
FIG. 3 illustrates the current mirror of FIG. 1 with a second embodiment of a damping network.

FIG. 3 shows a CMOS current mirror 13, in which the damping network has a series connection of two diodes 42, 44, which is located between the current input I_n and reference potential terminal 14. Diodes 42, 44 are preferably realized as transistor diodes 42, 44 with a short-circuited gate terminal and drain terminal. CMOS current mirror 13 behaves similar to CMOS current mirror 11.

Figure 4:
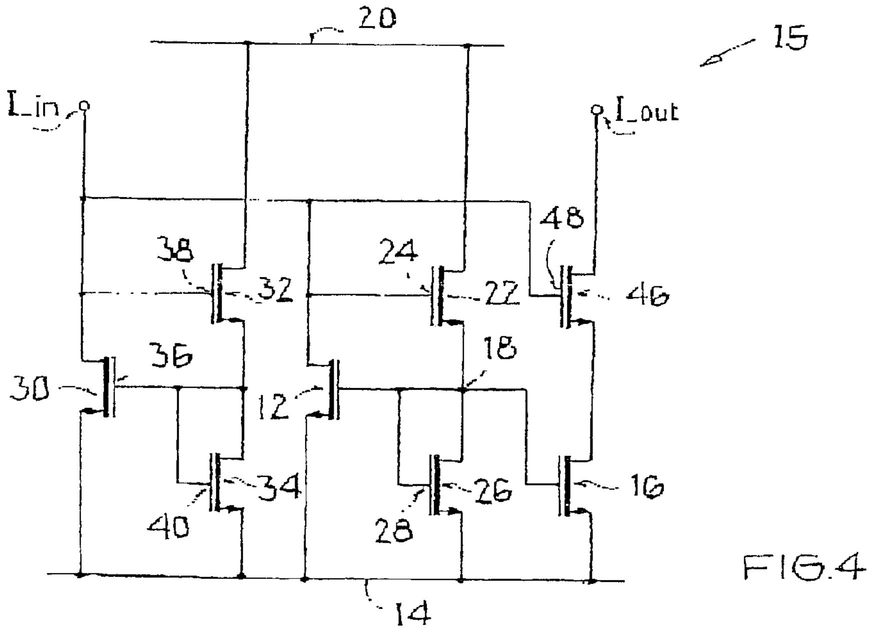
FIG. 4 illustrates the current mirror of FIG. 2 with an output cascode transistor.

FIG. 4 shows a CMOS current mirror 15, which differs from CMOS current mirror 10 in an output cascode transistor 46. In this case, a gate terminal 48 of output cascode transistor 46 is connected to the current input I_n, and the conductivity path of output cascode transistor 46 is located between the current output I_out and the conductivity path of output transistor 16. Due to output cascode transistor 46, current mirror 15 has an increased output resistance in comparison with current mirror 10. Nevertheless, output cascode transistor 46 reduces the drivability of the current output I_out. Therefore, the voltage at current output I_out with current mirror 15 must be higher than with current mirror 10, in order to avoid output cascode transistor 46 operating within the triode range.

Figure 5:
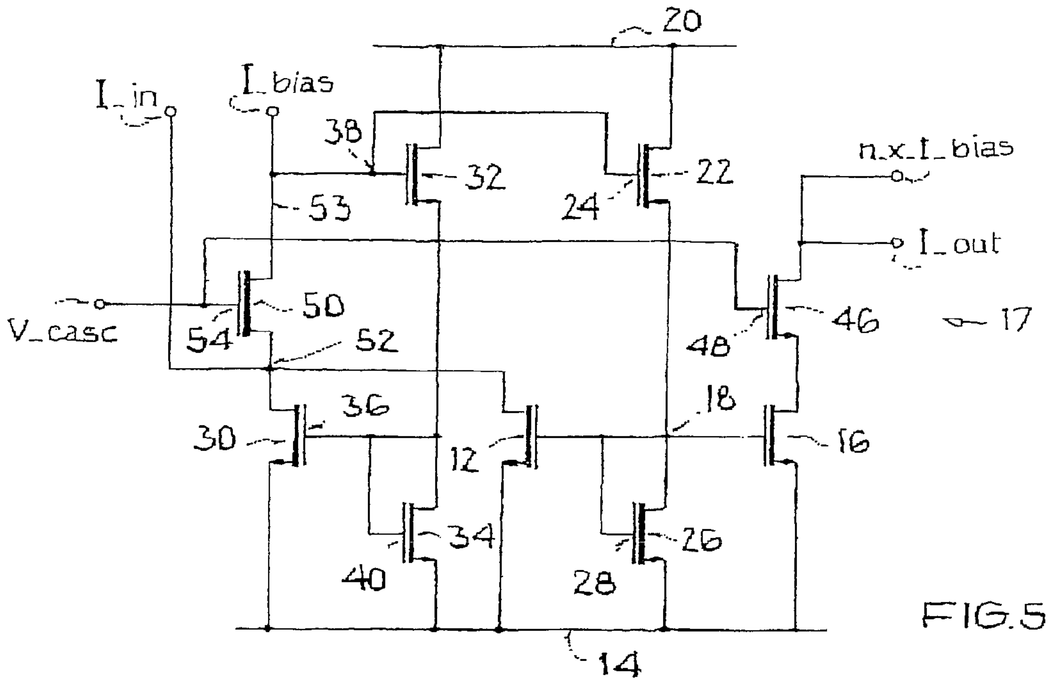
FIG. 5 illustrates an embodiment with a low-voltage cascode.

FIG. 5 shows a CMOS current mirror 17, in which the current input has a main current input I_in and an auxiliary current input I_bias, as well as an input cascode transistor 50. The conductivity path of input cascode transistor 50 is connected with one end 52 to the main current input I_in, whereas the other end 53 of the conductivity path forms the auxiliary current input I_bias or is connected thereto. Gate terminal 54 of input cascode transistor 50 is connected to gate terminal 48 of output cascode transistor 46 and to a cascode control terminal V_casc. Furthermore, gate terminal 24 of first additional transistor 22, together with gate terminal 38 of second damping transistor 32, is connected to the auxiliary current input I_bias.

When n is the transformation ratio of current mirror 17, with the resulting auxiliary currents, I_bias and n−x_I_bias, and cascode transistors 46, 50, the input voltage necessary at the current input or at the main current input I_in is reduced from two drain-source voltages to one drain-source voltage. In addition, current mirror 17, just as current mirror 15 of FIG. 4, has an increased output resistance compared with current mirror 10 of FIGS. 1-3.

Figure 6:
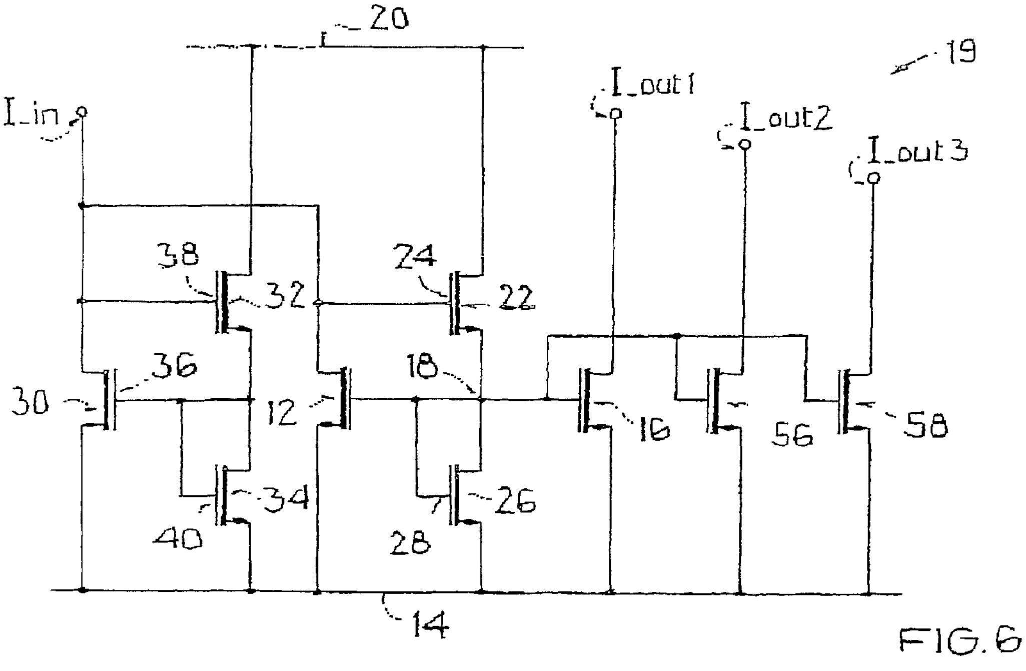
FIG. 6 illustrates an embodiment with several outputs (current bank)

FIG. 6 shows a current mirror 19 with several outputs I_out1, I_out2, I_out3, whereby each output I_out1, I_out2, I_out3 has its own output transistor 16, 56, 58, whose conductivity path is connected in each case to reference potential terminal 14 and whose gate terminal in each case is connected to common gate node 18. Each output transistor 16, 56, 58 supplies a current output I_out1, I_out2, I_out3 with an output current.

It is understood that current mirror 19 may also have any other desired number of output transistors instead of three output transistors 16, 56, 58. The shown embodiment of this type of CMOS current mirror 19, functioning as a current bank, with several outputs I_out1, I_out2, I_out3 is based on current mirror 11 of FIG. 2. It is understood, however, that the embodiment with several outputs can be combined not only with current mirror 11, but also with the other current mirrors 10, 13, 15, 17, and with the embodiments of current mirrors still to be described hereafter.

Figure 7:
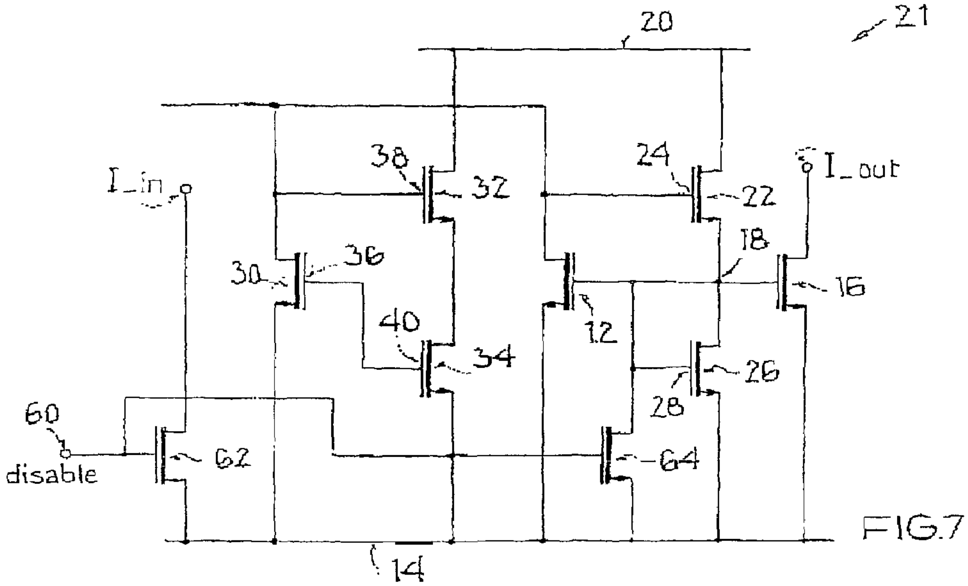
FIG. 7 illustrates an embodiment with additional disable transistors, which enable a rapid switching off.

FIG. 7 shows a CMOS current mirror 21 with an additional disable input 60, which is connected to a gate terminal of a first disable transistor 62 and a gate terminal of a second disable transistor 64. In this case, a conductivity path of first disable transistor 60 is located between the current input I_in and reference potential terminal 14, whereas a conductivity path of second disable transistor 64 is located between common gate node 18 and reference potential terminal 14.

If a signal, driving disable transistors 62 and 64, is applied at disable input 60, the input I_in and common gate node 18 are each connected in a low-impedance manner to reference potential terminal 14, as a result of which current mirror 21 is rapidly turned off.

It is understood that disable terminal 60 with the two disable transistors 62 and 64 can be combined with any other current mirror presented in this application.

Figure 8:
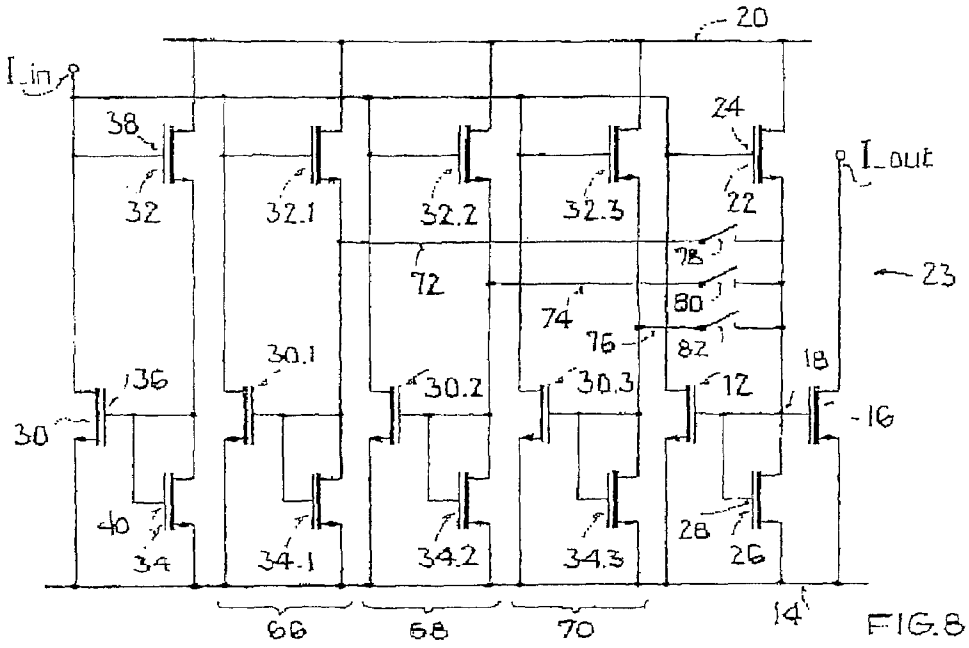
FIG. 8 illustrates an embodiment with a discretely adjustable damping.

FIG. 8 shows a CMOS current mirror 23, which, apart from the already described damping network of damping transistors 30, 32, 34, has other damping subnetworks 66, 68, 70 of additional damping transistors 30.1, 30.2, 30.3, 32.1, 32.2, 32.3, 34.1, 34.2, 34.3. Each additional damping subnetwork 66, 68, 70 in each case has a connection path 72, 74, 76 to common gate node 18. Each connection path 72, 74, 76 has a controllable resistor. In the diagram of FIG. 8, the controllable resistor is each time a switch 78, 80, 82, with which the connection path 72, 74, 76 can be separated. The controllable resistor in this case can be reversed or switched digitally in each case between a low value with a closed switch 78, 80, 82 and a theoretically infinitely high value with an opened switch 78, 80, 82.

It is possible to vary the damping with use of additional damping transistors 30.1, 30.2, 30.3, 32.1, 32.2, 32.3, 34.1, 34.2, 34.3 and the aforementioned switch 78, 80, 82. The more switches 78, 80, 82 are closed, the shorter the rise time and the lower the damping of current mirror 23. With closed switch 78, associated damping transistors 30.1, 32.1, 34.1 are effectively connected parallel to transistors 12, 16, 26. With an opened switch 78, associated transistors 30.1, 32.1, 34.1, in contrast, are effectively connected parallel to damping transistors 30, 32, 34 of a permanently operating damping network. This also applies in analogy to damping transistors 30.2, 32.2, 34.2 in conjunction with switch 80, and to damping transistors 30.3, 32.3, 34.3 in conjunction with switch 82. It is understood that the number of the additional switchable damping subnetworks is not limited to the depicted three additional damping subnetworks, but that in principle any desired number of damping subnetworks may be used.

Figure 9:
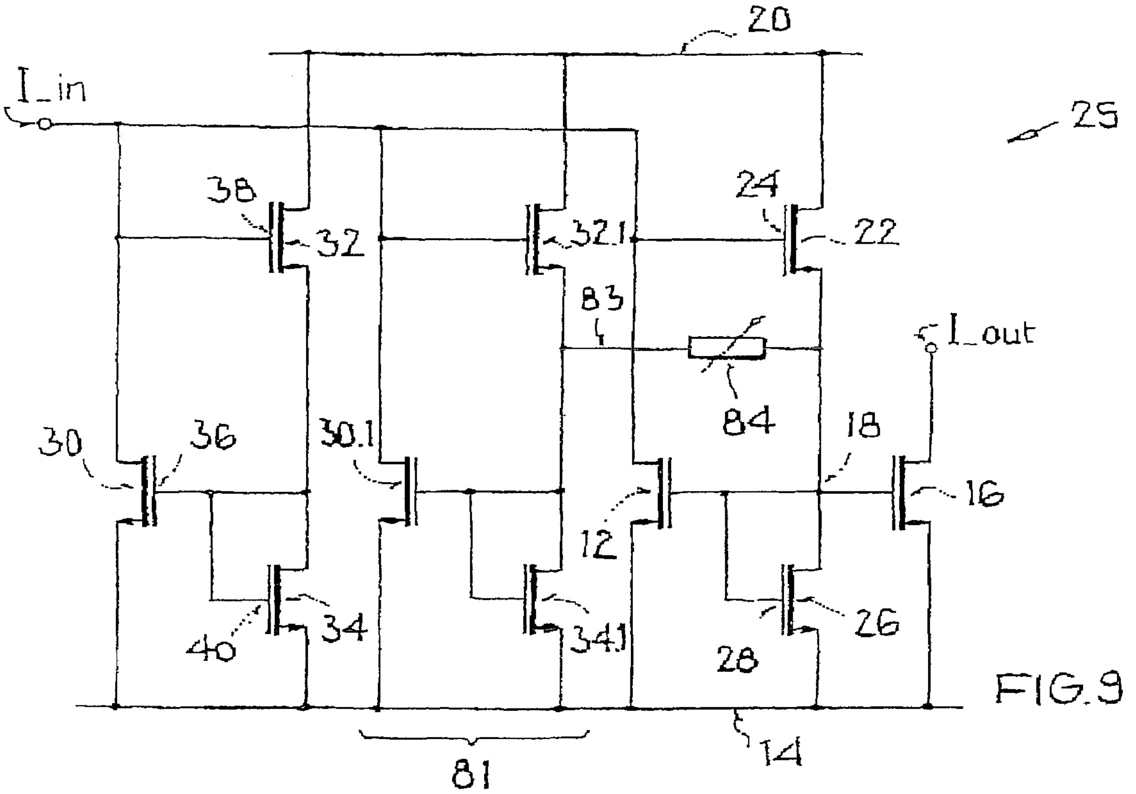
FIG. 9 illustrates an embodiment with a continuously adjustable damping.

Alternatively to a discrete connection or disconnection of individual subcircuits, the damping action of an individual subcircuit may also be set continuously. An embodiment permitting this is shown in FIG. 9 as CMOS current mirror 25. The embodiment of FIG. 9 has an additional damping subnetwork 81, which is connected via a connection path 83 to common gate node 18 and has damping transistors 30.1, 32.1, and 34.1. Connection path 83 has a MOS transistor 84, which represents a controllable resistor during operation in its resistance region. The setting of a low resistance corresponds in its effect to the closing of a switch in the embodiment of FIG. 8. By analogy, the setting of a high resistance corresponds qualitatively to the opening of a switch in the embodiment of FIG. 8. Different from the embodiment of FIG. 8, controllable resistor 84 in the subject of FIG. 9 also permits a continuous setting of intermediate values.

The invention was described with use of embodiments with NMOS transistors. It is understood, however, that it can also be realized with PMOS transistors with suitable adjustment of the DC potential. Furthermore, various embodiments were described in conjunction with the damping network of FIG. 2. It is understood, however, that these embodiments can also be realized with the damping network of FIG. 3.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A CMOS current mirror comprising:

a current input;

an input transistor whose conductivity path is provided between the current input and a reference potential terminal;

a current output;

an output transistor whose conductivity path is operatively connected to the reference potential terminal to supply the current output with an output current;

a gate node that is common for the input and output transistors; and a supply potential terminal, wherein the current mirror has a first additional transistor whose conductivity path is provided between the supply potential terminal and the gate node and whose gate terminal is connected to the current input, and wherein the current mirror has a second additional transistor whose conductivity path is provided between the gate node and the reference potential terminal and whose gate terminal is connected to the gate node.

2. The CMOS current mirror according to claim 1, wherein the current mirror further comprises a damping network of damping transistors, the damping network being connected to the current input and the reference potential terminal.

3. The CMOS current mirror according to claim 2, wherein the damping network comprises:

a first damping transistor;

a second damping transistor; and a third damping transistor, wherein a conductivity path of the first damping transistor is provided between the current input and the reference potential terminal, a conductivity path of the second damping transistor is provided between the supply potential terminal and a gate terminal of the first damping transistor, a conductivity path of the third damping transistor is provided between the gate terminal of the first damping transistor and the reference potential terminal, and a gate terminal of the second damping transistor is connected to the current input and a gate terminal of the third damping transistor to the gate terminal of the first damping transistor.

4. The CMOS current mirror according to claim 2, wherein the current mirror has a damping network with a series connection of two transistor diodes, which is provided between the current input and the reference potential terminal.

5. The CMOS current mirror according to claim 1, wherein the current mirror has an output cascode transistor whose conductivity path is provided between the current output and the conductivity path of the output transistor.

6. The CMOS current mirror according to claim 5, wherein a gate terminal of the output cascode transistor is connected to the current input.

7. The CMOS current mirror according to claim 5, wherein the current mirror has a current input with a main current input and an auxiliary current input and an input cascode transistor, wherein the conductivity path of the input cascode transistor is connected with a first end to the main current input and with a second end forms the auxiliary current input, wherein the gate terminals of the input cascode transistor and of the output cascode transistor are connected to one another and to a cascode control terminal, and wherein the gate terminal of the first additional transistor is connected to the auxiliary current input.

8. The CMOS current mirror according to claim 1, wherein the current mirror further comprises a plurality of output transistors whose conductivity paths are connected to the reference potential terminal and each of which supply a current output with an output current and whose gate terminals are connected to the common gate node.

9. The CMOS current mirror according to claim 1, wherein the current mirror has a disable input, which is connected to a gate terminal of at least one disable transistor, wherein a conductivity path of the disable transistor is provided between the current input and the reference potential terminal or between the common gate node and the reference potential terminal.

10. The CMOS current mirror according to claim 9, wherein the disable input is connected to a gate terminal of a first disable transistor and a gate terminal of a second disable transistor, wherein a conductivity path of the first disable transistor is provided between the current input and the reference potential terminal and a conductivity path of the second disable transistor is provided between the common gate node and the reference potential terminal.

11. The CMOS current mirror according to claim 1, wherein the current mirror has at least one damping subnetwork with a connection path to the common gate node, and wherein the connection path has a controllable resistor.

12. The CMOS current mirror according to claim 11, wherein the current mirror has several damping subnetworks, each with a connection path to the common gate node, each connection path having a controllable resistor.

13. The CMOS current mirror according to claim 11, wherein the controllable resistor is a switch.

14. The CMOS current mirror according to claim 11, wherein the controllable resistor is a MOS transistor operating within a resistance region.

* * * * *